(12) United States Patent
Furman et al.

(10) Patent No.: US 8,107,572 B1
(45) Date of Patent: Jan. 31, 2012

(54) COMMUNICATIONS SYSTEM USING ADAPTIVE FILTER FOR INTERFERENCE REDUCTION

(75) Inventors: William N. Furman, Fairport, NY (US); John W. Nieto, Rochester, NY (US); Fred C. Kellerman, Webster, NY (US); Brian C. Padalino, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 1145 days.

(21) Appl. No.: 11/871,174

(22) Filed: Oct. 12, 2007

(51) Int. Cl.
    *H04B 1/10* (2006.01)

(52) U.S. Cl. ........ 375/350; 375/229; 375/230; 375/231; 375/232; 375/233; 375/234; 375/316; 375/340; 375/346; 375/349; 455/63.1; 455/114.2; 455/296; 455/501; 370/335; 370/342; 708/300; 327/551

(58) Field of Classification Search .......... 375/229–234, 375/316, 340, 346, 349, 350; 455/63.1, 114.2, 455/296, 501; 708/300; 327/551; 370/335, 370/342

See application file for complete search history.

(56) References Cited

U.S. PATENT DOCUMENTS

| | | | | |
|---|---|---|---|---|
| 5,377,226 A | 12/1994 | Davis | ................................. | 375/1 |
| 5,570,423 A | 10/1996 | Walker et al. | ................. | 379/410 |
| 5,777,910 A | 7/1998 | Lu | .............................. | 364/724.2 |
| 5,838,740 A | 11/1998 | Kallman et al. | .............. | 375/346 |
| 5,963,592 A | 10/1999 | Kim | .............................. | 375/232 |
| 6,037,886 A | 3/2000 | Staszewski et al. | ........... | 341/139 |
| 6,201,843 B1 | 3/2001 | Kingston et al. | .............. | 375/350 |
| 6,285,412 B1 | 9/2001 | Twitchell | ....................... | 348/608 |
| 6,563,868 B1* | 5/2003 | Zhang et al. | .................... | 375/232 |
| 6,859,641 B2 | 2/2005 | Collins et al. | ................. | 455/63.1 |
| 6,980,609 B1 | 12/2005 | Ahn | ............................... | 375/343 |
| 7,050,491 B2 | 5/2006 | McDonald et al. | ........... | 375/232 |
| 7,085,240 B2* | 8/2006 | Wu et al. | ......................... | 370/252 |
| 7,194,025 B2 | 3/2007 | Wood et al. | ..................... | 375/231 |
| 2004/0229590 A1* | 11/2004 | Kubo et al. | ..................... | 455/307 |
| 2005/0058232 A1* | 3/2005 | Murakami et al. | ............ | 375/350 |
| 2005/0213652 A1 | 9/2005 | Higashino | ....................... | 375/233 |
| 2005/0220230 A1 | 10/2005 | Fukuda | ........................... | 375/343 |
| 2005/0259728 A1 | 11/2005 | Nieto | ............................. | 375/233 |
| 2006/0020650 A1 | 1/2006 | Shen et al. | ...................... | 708/300 |
| 2006/0109938 A1* | 5/2006 | Challa et al. | .................... | 375/347 |
| 2006/0176947 A1 | 8/2006 | Lim | ................................ | 375/232 |
| 2007/0058710 A1 | 3/2007 | Chang | ............................ | 375/233 |
| 2007/0201588 A1* | 8/2007 | Loiseau et al. | ................. | 375/346 |
| 2008/0013657 A1* | 1/2008 | Aouine et al. | ................. | 375/350 |

\* cited by examiner

*Primary Examiner* — Leon Flores
(74) *Attorney, Agent, or Firm* — Allen, Dyer, Doppelt, Milbrath & Gilchrist, P.A.

(57) ABSTRACT

A communications system receives a modulated signal that carries encoded communications data. An adaptive filter circuit has a plurality of adaptive filters each having a plurality of non-adaptive and adaptive filter taps with weighted coefficients. At a selected adaptive filter, an interference reduction circuit is responsive to one of at least a received state of a demodulator, the type of modulation used by communication system and the input and output power of adaptive filter for updating the adaptive gain of the adaptive filter, selecting the number and order of adaptive filter taps, separating the spacing of multipath introduced by adaptive filter, controlling input and output normalizing circuits to adaptive filter(s) and selecting if signal passed to demodulator is original received signal or signal output by adaptive filter. A demodulator and decoder receive the filtered output signal and demodulate and decode the signal to obtain the communications data.

16 Claims, 12 Drawing Sheets

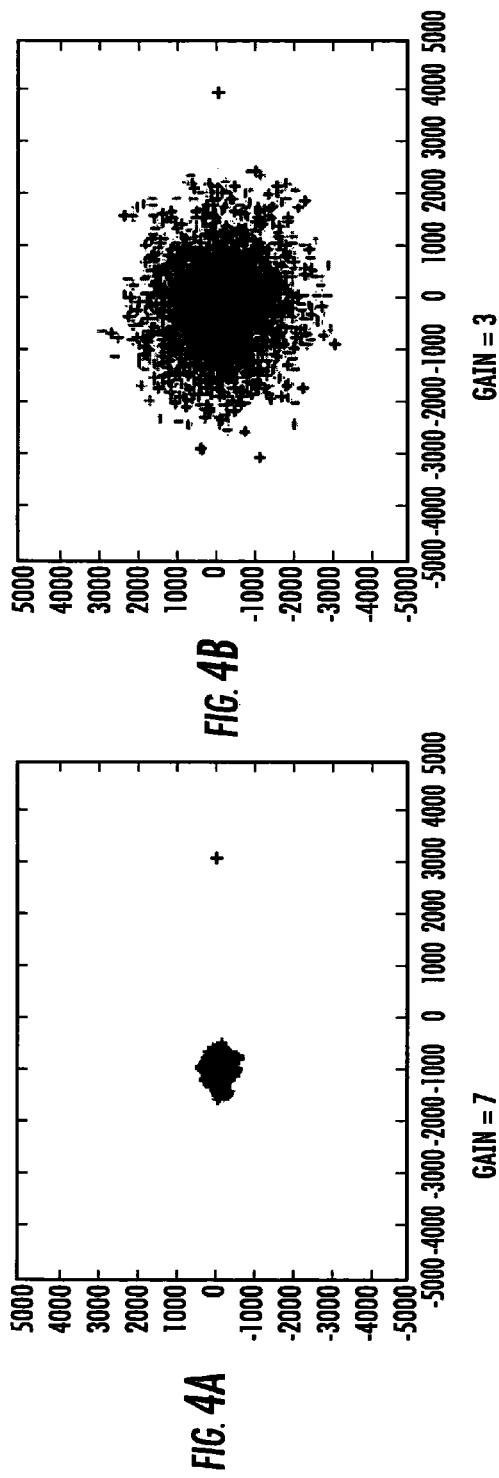
FIG. 4A  GAIN = 7
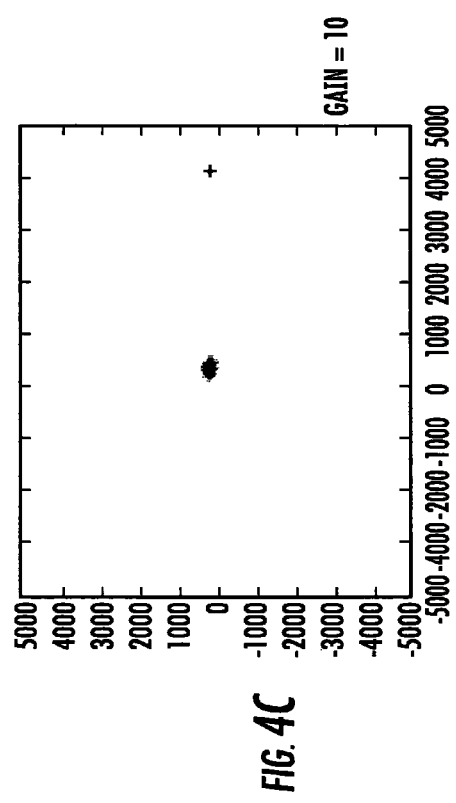
FIG. 4B  GAIN = 3
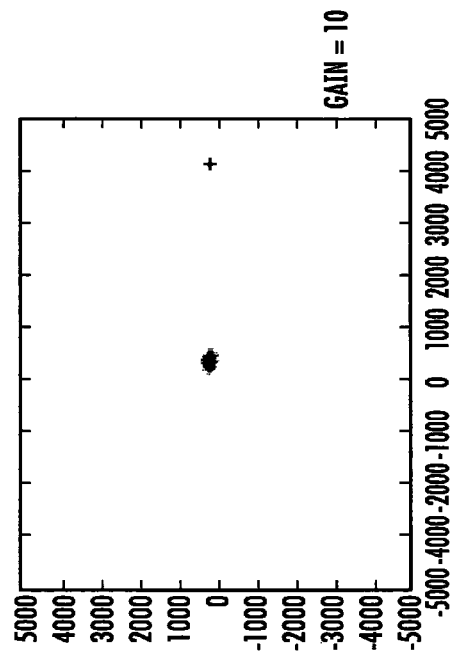
FIG. 4C  GAIN = 10

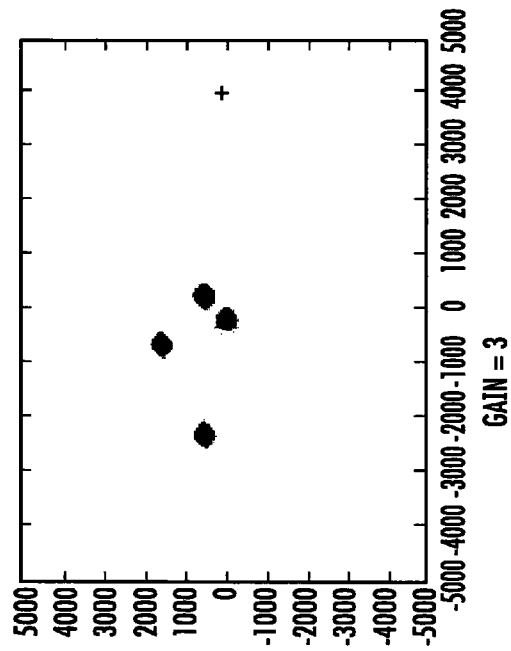
FIG. 5B GAIN = 3
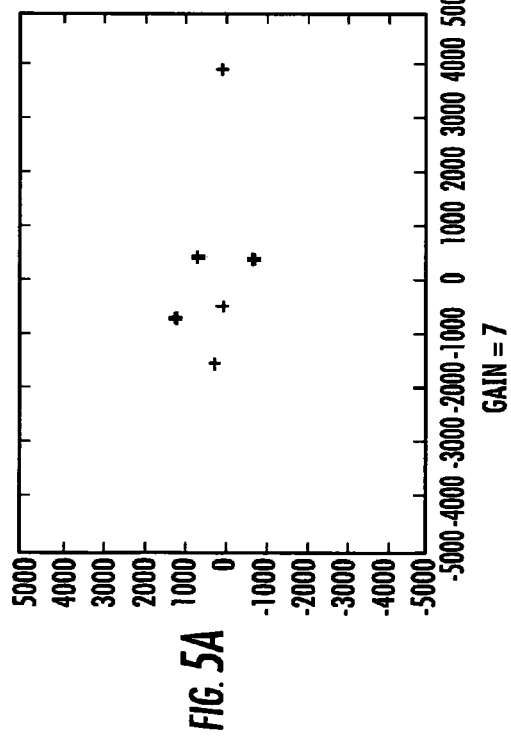
FIG. 5A GAIN = 7
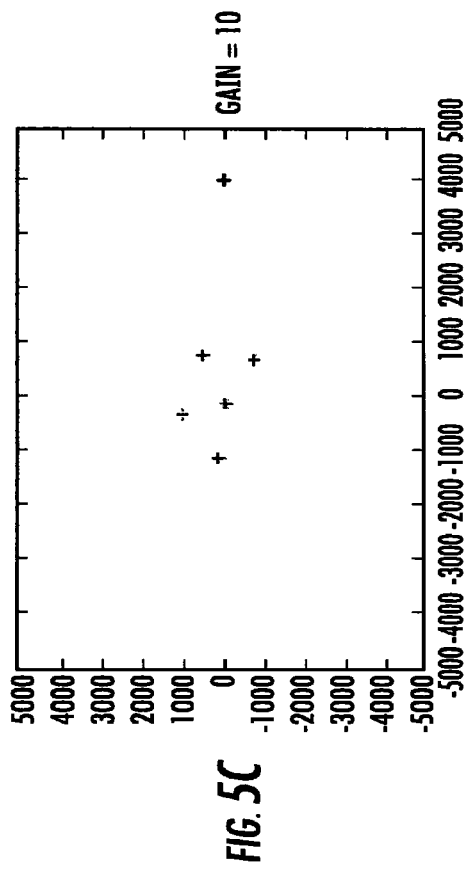
FIG. 5C GAIN = 10

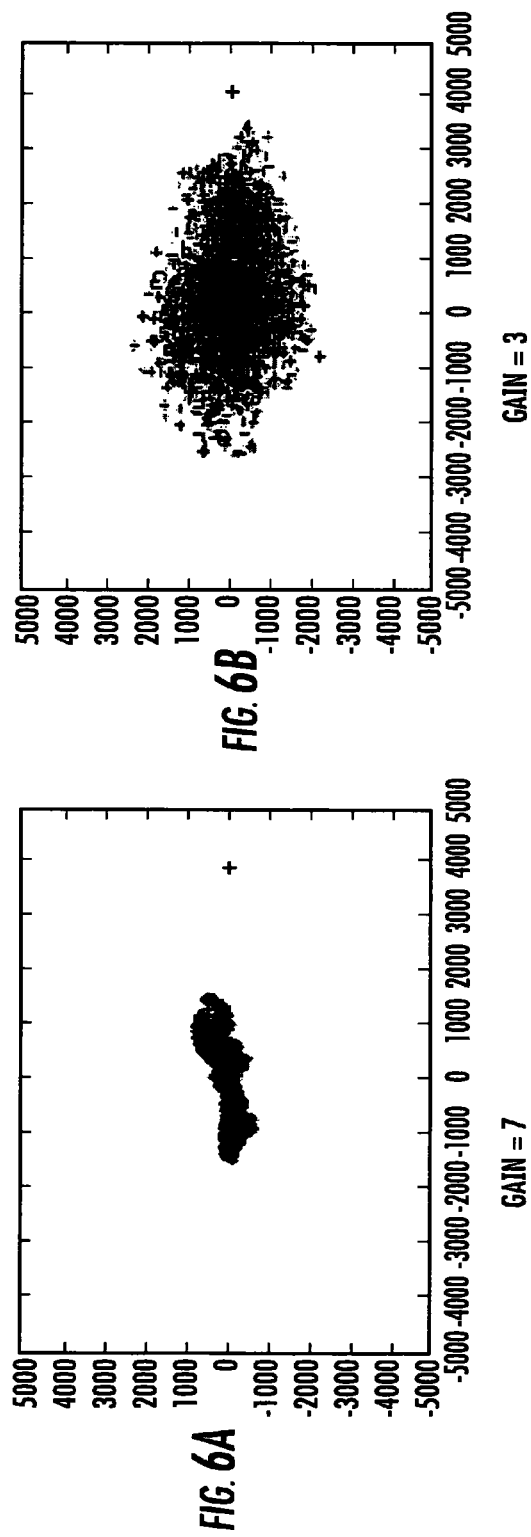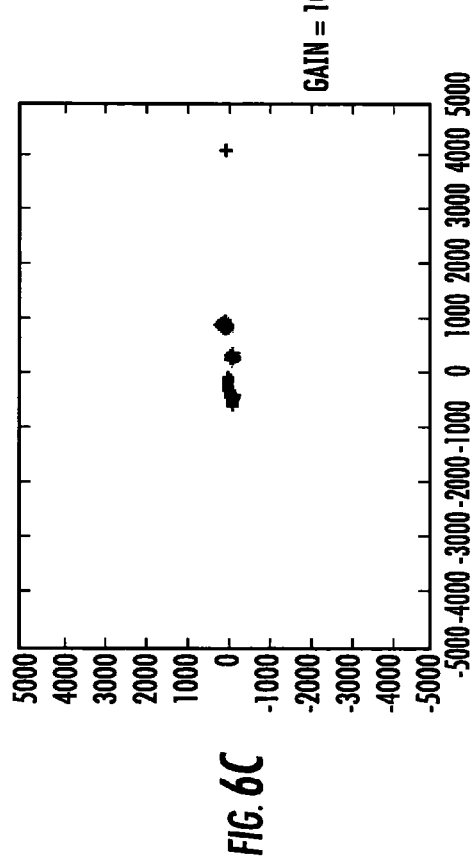
FIG. 6A GAIN = 7
FIG. 6B GAIN = 3
FIG. 6C GAIN = 10

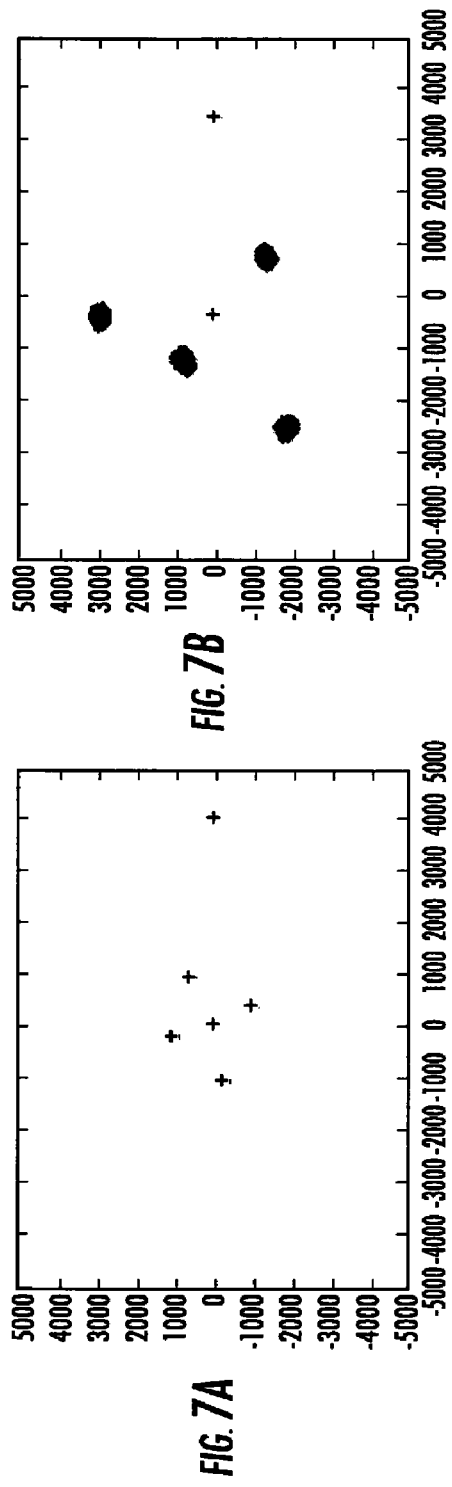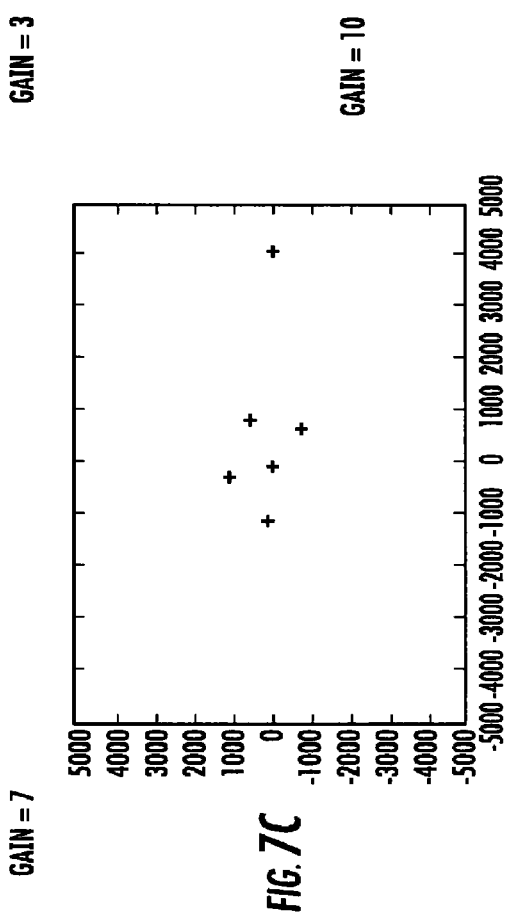
FIG. 7A  GAIN = 7
FIG. 7B  GAIN = 3
FIG. 7C  GAIN = 10

COMMUNICATIONS SYSTEM USING ADAPTIVE FILTER FOR INTERFERENCE REDUCTION

FIELD OF THE INVENTION

The present invention relates to communications, and more particularly, the present invention relates to adaptive filters used in communications systems to reduce signal interference due to intentional or unintentional narrowband jammers.

BACKGROUND OF THE INVENTION

Radio communication channels such as HF, VHF and UHF introduce distortion in the form of multipath and fading into the originally transmitted signal. A result of these types of channels is inter-symbol interference (ISI), which occurs if the modulation bandwidth exceeds the coherent bandwidth of the radio channel and causes the modulation pulses to spread in time to adjacent symbols. Intersymbol interference can also be caused by the radio channel exhibiting time and frequency dispersion (e.g., delay spread and Doppler spread) due to the presence of signal reflectors/scatterers in the environment or the relative motion of transmitter and receiver. Intersymbol interference has also been known to cause bit errors at the receiver, which distorts the intended message content. To address such transmission channel distortion, many different types of channel estimation algorithms and adaptive equalizers have been included in the receivers.

Modern communication systems are requiring wider and wider bandwidth signals in order to support the data rates desired by users. The large amount of legacy equipment in the HF/UHF/VHF bands can at times cause unintentional interference to these new wideband systems. In addition, intentional jamming can also occur. Adaptive filters are commonly used in communication systems to reduce the effects of narrowband interferers. An adaptive filter can process the communication signal prior to acquisition, demodulation, equalization and decoding. Adaptive filters do not require knowledge of the channel in advance and incorporate an Infinite Impulse Response (IIR) or Finite Impulse Response (FIR) filter with adaptive filter coefficients that adjust themselves to achieve a desired result, such as minimizing unwanted narrowband interference of the input signal. The adaptive filter typically uses an adaptive Recursive Least Squares (RLS), Least Mean Squares (LMS) or Minimum Mean-Square Error (MMSE) estimation as an algorithm.

Modern communication systems typically transmit a preamble (i.e. a known waveform section) which demodulators can use to achieve waveform synchronization. In addition, the preamble may also contain information transmitted in a very robust fashion used to indicate the waveform parameters used for the data portion of transmission that follows this initial preamble (i.e. modulation type (2-PSK, 4-PSK, 8-PSK, 16-QAM, etc), burst length, type of forward error correction, etc). When a system incorporates waveform information in its preamble it is referred to as an autobaud system. When another mechanism is used to convey this information, such as a control channel or a separate transmission providing this information, the preamble is used only for synchronization. It may be advantageous to a communication system to feedback demodulator state (preamble search state, preamble state, and data state) and demodulator information (modulation type, etc) to adaptive filter to more effectively deal with narrowband interference while reducing the effects of adaptive filter on the data portion of waveform.

There are many design tradeoffs when using adaptive filters in modern wideband UHF/VHF tactical radios such as number of filter taps, speed of adaptation, etc. In addition, many platform (i.e. radio hardware) constraints such as size, weight, power and relatively small Field Programmable Gate Array (FPGA) usage are imposed on the adaptive filter design. The proper tradeoff in the adaptive filter design is necessary so that more than one interferer can be handled by adaptive filter (typically three to four is desired) while still meeting platform constraints. Examples of interferers in the HF/VHF/UHF band are analog frequency modulation (FM) voice, frequency shift keying (FSK) signals (i.e. 16 kbps FSK), tone signals or carriers.

Some adaptive filters incorporate spectral based techniques that use a Fast Fourier Transform (FFT), thus, making them too complex for some radio implementations. Adaptive filters such as Finite Impulse Response (FIR) filters, or Infinite Impulse Response (IIR) filters exist and have been found to work well at lower bit rates and bandwidths. Both types of filters, however, have some drawbacks, but with improvements, should provide important design enhancements for adaptive filters used in complex communications systems.

SUMMARY OF THE INVENTION

A communications system receives a modulated signal that carries encoded communications data. An adaptive filter circuit comprises a plurality of adaptive filters, each having a plurality of non-adaptive and adaptive filter taps with weighted coefficients. An interference reduction circuit at each filter is selected and responsive to one of at least a received state of a demodulator, the type of modulation used by communication system and power input and output by adaptive filter for updating the adaptive gain of the adaptive filter, selecting the number and order of adaptive filter taps, separating the spacing of multipath introduced by adaptive filter, controlling input and output normalizing circuits to filter and selecting if signal passed to demodulator is original received signal or signal output by the adaptive filter circuit. A demodulator and decoder receive the selected output signal and demodulate and decode the signal to obtain the communications data.

The interference reduction circuit can include an adaptive gain circuit for updating the adaptive gain of the adaptive filter responsive to a receive state of a demodulator or the type of modulation used by communication system (i.e. signal modulation). It can include a tap order selection circuit for selecting the number and order of adaptive filter taps based on one of at least input power to adaptive filter, the output power from the adaptive filter and signal modulation. A variable delay circuit can be operative before the adaptive filter taps and weighted coefficients for separating the spacing of multipath introduced by adaptive filter and producing a filtered output signal for improved multipath performance and reduction of narrowband interference. This variable delay circuit can be responsive to a measured amount of multipath and multipath tolerances for varying the delay and adjusting the spacing of any multipath introduced by adaptive filter.

In yet another aspect, the interference reduction circuit is formed as a switch operative with the adaptive filter for selecting which signal is sent to demodulator such as the original received signal (i.e. unfiltered) or the output from the adaptive filter. An input normalizing circuit obtains sample values from a received signal input to the adaptive filter to increase gain recovery based on signal modulation, demodulator state such as preamble search, preamble detected and data state and/or other signal acquisition information. An output normalizing circuit obtains sample values from the output of adaptive filter to increase gain recovery based on signal modulation, demodulator state such as preamble search, preamble detected and data state and/or other signal acquisition information. This adaptive filter is responsive to a Least Mean Square (LMS), Recursive Least Squares (RLS) or Minimum Mean-Square Error (MMSE) estimation as an adaptive algorithm that iterates over weighted coefficients towards a gradient to reduce error and generate new weighted coefficients. A wireless communications device can incorporate the demodulator and decoder.

An adaptive filter and a method aspect is also set forth.

BRIEF DESCRIPTION OF THE DRAWINGS

Other objects, features and advantages of the present invention will become apparent from the detailed description of the invention which follows, when considered in light of the accompanying drawings in which:

FIGS. 4A through 4C show graphs for the effect of the update gain on Gaussian noise input for respective gains of $\frac{1}{2}^7$, $\frac{1}{2}^3$ and $\frac{1}{2}^{10}$ in accordance with a non-limiting example of the present invention.

FIGS. 5A through 5C show the effect of the update gain on Gaussian noise and a tone (20 dB) input for respective gains of $\frac{1}{2}^7$, $\frac{1}{2}^3$ and $\frac{1}{2}^{10}$ in accordance with a non-limiting example of the present invention.

FIGS. 6A through 6C show the effect of update gain on a GMSK (Gaussian Minimum Shift Keying) signal input with respective gains of $\frac{1}{2}^7$, $\frac{1}{2}^3$ and $\frac{1}{2}^{10}$ in accordance with a non-limiting example of the present invention.

FIGS. 7A through 7C show the effect of update gain on a GMSK signal and a tone (20 dB) input with respective gains of $\frac{1}{2}^7$, $\frac{1}{2}^3$ and $\frac{1}{2}^{10}$ in accordance with a non-limiting example of the present invention.

DETAILED DESCRIPTION OF THE PREFERRED EMBODIMENTS

Figure 1:
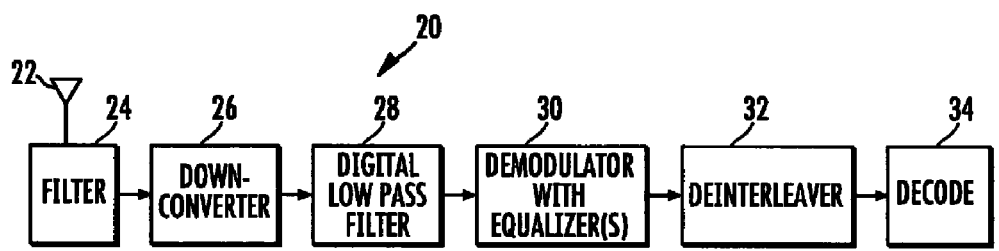
FIG. 1 is a block diagram showing basic signal processing modules or components used in a conventional receiver that incorporates a demodulator, equalizer and decoder.

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art. Like numbers refer to like elements throughout.

The different embodiments as will be explained below describe an adaptive filter as a narrow band interference (NBI) filter. Although an adaptive Finite Impulse Response (FIR) filter is preferred, the adaptive filter could be formed as an Infinite Impulse Response (IIR) filter. In one embodiment, an additional variable delay between the fixed and adaptive taps is included. This delay improves multipath performance by making the multipath resolvable for the channel estimation algorithms and equalizers used in demodulator circuit. Because the input power of the adaptive filter relative to the output power of the adaptive filter is a good indicator of interference suppression, this power can be measured and information fed back to control a variable delay before the adaptive taps and to control an automatic tap order selection circuit.

A large single interferer or jammer is often best handled by one or two taps (less taps reduces ISI introduced by adaptive filter), and in accordance with a non-limiting example of the present invention, the number of taps can be chosen or updated to accommodate signal changes, such as the appearance of a large interferer or jammer. The adaptive filter uses the state of the receive modem (i.e. demodulator) to select an adaptive update gain, while a variable delay is placed between the fixed and adaptive taps. An automatic application of the adaptive filter can be based on the measured output power by bypassing the adaptive filter or selecting the output of the adaptive filter. The tap order selection can be based automatically on the modulation of the data portion of waveform and the adaptive filter state. The variable adaptive gain can be based on the demodulator state such as the preamble search, preamble, data and also on the waveform modulation of data portion of waveform.

The communications system includes an adaptive filter to provide an enhancement for automatically selecting whether to use the adaptive filter output and automatically determining the optimum number of adaptive filter taps based on the adaptive filter performance and the modulation of the data portion of waveform. The adaptive filter can adjust its update gain based on the demodulator state and adjust the variable delay before the adaptive taps to improve the modem performance based on feedback from demodulator.

The communications system uses the adaptive filter, in accordance with a non-limiting example of the present invention, to remove narrow band interferers or jammers for many different wideband waveforms, overcoming the disadvantages that occur when a standard handheld radio is within range of a wideband receiver and disrupts reception. A wideband waveform could be a key differentiator of newer manpack and handheld radios, and the adaptive filter, in accordance with a non-limiting example of the present invention, can work advantageously in real tactical radio environments.

Selected non-limiting parameters can include a gain with the variables of $\frac{1}{2}^7$, $\frac{1}{2}^3$ and $\frac{1}{2}^{10}$, and the total number of taps can vary from as few as one to about 3 to 6 in a non-limiting example. The number of adaptive taps can vary from 1 to 4 in another non-limiting example. The system provides multiple, delayed taps (spaced at the symbol rate of modulated waveform) that are adaptive after a first fixed tap in one embodiment and an automatic in/out filter selection based on the output power of the adaptive filter. The order or number of taps can be automatically selected based on the output power of the adaptive filter. An adaptive update gain can be based on the receive state of the modem, including the search, preamble and data and the modulation such as GMSK (Gaussian Minimum Shift Keying), BPSK (Binary Phase Shift Keying), QPSK (Quadrature Phase Shift Keying), M-PSK (M-ary Phase Shift Keying) and M-QAM (M-ary Quadrature Amplitude Modulation, i.e. 16-QAM).

It should be appreciated by one skilled in the art that the approach to be described is not limited for use with any particular communication standard (wireless or otherwise) and can be adapted for use with numerous wireless (or wired) communications standards such as Enhanced Data rates for GSM Evolution (EDGE), General Packet Radio Service (GPRS) or Enhanced GPRS (EGPRS), extended data rate Bluetooth, Wideband Code Division Multiple Access (WCDMA), Wireless LAN (WLAN), Ultra Wideband (UWB), coaxial cable, radar, optical, etc. Further, the invention is not limited for use with a specific PHY or radio type but is applicable to other compatible technologies as well.

Throughout this description, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. Wireless communication involves: radio frequency communication; microwave communication, for example long-range line-of-sight via highly directional antennas, or short-range communication; and/or infrared (IR) short-range communication. Applications may involve point-to-point communication, point-to-multipoint communication, broadcasting, cellular networks and other wireless networks.

As will be appreciated by those skilled in the art, a method, data processing system, or computer program product can embody different examples in accordance with a non-limiting example of the present invention. Accordingly, these portions may take the form of an entirely hardware embodiment, an entirely software embodiment, or an embodiment combining software and hardware aspects. Furthermore, portions may be a computer program product on a computer-usable storage medium having computer readable program code on the medium. Any suitable computer readable medium may be utilized including, but not limited to, static and dynamic storage devices, hard disks, optical storage devices, and magnetic storage devices.

The description as presented below can apply with reference to flowchart illustrations of methods, systems, and computer program products according to an embodiment of the invention. It will be understood that blocks of the illustrations, and combinations of blocks in the illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, implement the functions specified in the block or blocks.

These computer program instructions may also be stored in a computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

For purposes of description, there is now described a prior art communication system relative to FIG. 1, which schematically illustrates signal processing modules or steps of a conventional receiver that incorporates basic components. Referring to FIG. 1, the receiver 20 includes an antenna 22 for receiving the signal, a radio receiver filter 24 for limiting the bandwidth of the incoming signal (3 KHz for an HF signal as an example), a digital down-converter 26 for converting a signal from a 1800 Hz carrier to baseband (for an HF signal), a digital low pass filter 28, a demodulator 30 (with one or more equalizer), a deinterleaver 32, and a decoder 34 for forward error correction. Block interleavers and de-interleavers typically have several different user selectable lengths to allow selection of proper block size for current channel conditions. In accordance with non-limiting examples, filtering could occur prior to demodulation and equalization.

It should be understood that an adaptive filter uses the characteristics of the input signal. Typically, the adaptive filter, for example, an adaptive FIR filter, has a self-learning process and the adaptive algorithm is selected to reduce the error between the output signal and a desired signal. One algorithm as mentioned before is the Least Mean Squares (LMS) algorithm that approximates the steepest descent algorithm to use an instantaneous estimate of a gradient vector of a cost function. It should be understood that other algorithms such as RLS or MMSE algorithms can be used. For description, the LMS algorithm is described as a non-limiting example.

In the LMS algorithm, the estimate of the gradient is based on sample values of a tap-input vector and an error signal. The algorithm iterates over each coefficient in the filter, moving it in the direction of the approximated gradient. The LMS performance achieves its minimum value through the iterations of the adapting algorithm and the adaptive filter is finished when the coefficients converge to a solution such that the output from the filter matches the desired signal. When the input data characteristics such as the filter environment are changed, the filter adapts to the new environment by generating a new set of coefficients for new data.

When the LMS algorithm is used in an equalizer structure, the LMS algorithm uses a reference signal representing the desired filter output and the difference between the reference signal and the output of the filter is an error signal. Thus, the LMS algorithm finds a set of filter coefficients that minimizes the expected value of a quadratic error signal to achieve the least mean squared error. In many systems, the squared error is a quadratic function of the coefficient vector and there is typically a global minimum and no local minima.

Thus, the filter changes or adapts its parameters in response to changes in the operating environment such that the output can track a reference signal with minimum error as coefficients are changed. The equalizer can be operated in a training mode and a tracking mode. Channel characteristics can be learned for a first time in a training mode, while in the tracking mode, the characteristics of the channel are followed, assuming they do not change quickly. A specially chosen training signal could be applied to the channel input and is presumed to be known to the equalizer. In a tracking mode, while actual communication occurs, the signal is unknown to the equalizer.

Figure 2:
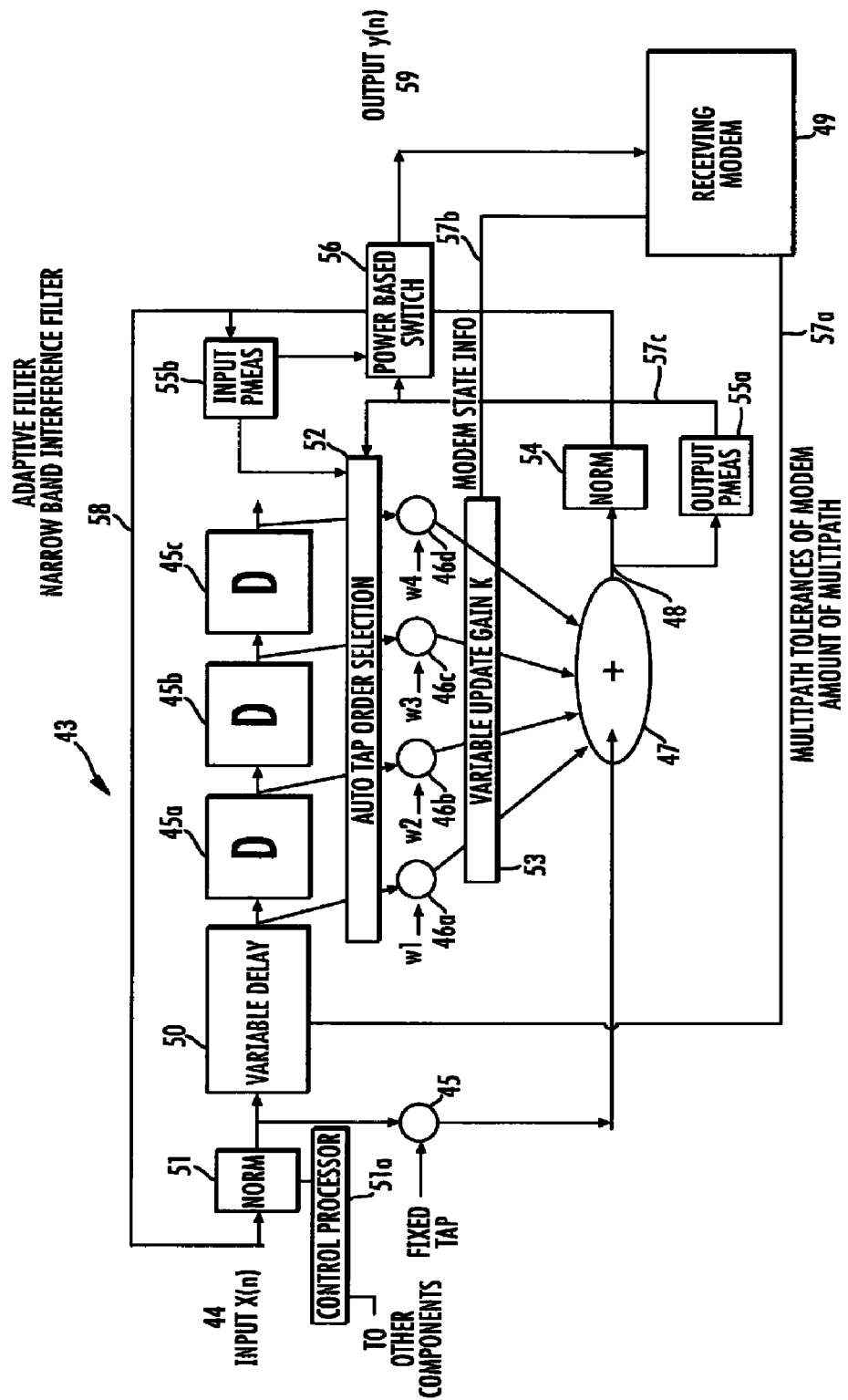
FIG. 2 is a block diagram of an adaptive filter in accordance with a non-limiting example of the present invention.

In accordance with a non-limiting example of the present invention, FIG. 2 illustrates a block diagram of an adaptive filter 43 for use in various examples of the present invention. Although the filter is illustrated as a Finite Impulse Response (FIR) Filter, it can be designed as an Infinite Impulse Response (IIR) filter. The adaptive filter 43 includes an input X(n) 44 and appropriate delay elements 45a-c (illustrated as three delay elements) and four weighted taps 46a-d and outputs that are summed within a summer 47. Other delay elements with appropriate weighted coefficients can possibly be used. A fixed tap 45 is included as illustrated before adaptive taps and could include one or more fixed taps, typically one. The output Y(n) 48 from the summer 47 is subsequently received within a receiving modem 49.

In accordance with a non-limiting example, a variable delay circuit 50 is incorporated between fixed and adaptive taps as illustrated. The input 44 is also passed through an input normalizer circuit 51 that can be controlled by a control processor 51a before reaching the variable delay circuit 50. An automatic tap order selection circuit 52 is incorporated within the filter as well as a variable update gain circuit 53. From the summer 47, the output 48 is passed through an output normalizer circuit 54, which can be controlled by the control processor 51a, and an output power measuring circuit 55a. Input power can be measured at an input power measuring circuit 55b. A power based switch 56 at the output allows the input signal 44 to be switched either directly to the receiving modem 49 or through the adaptive filter by means of a bypass channel 58.

The receiving modem 49 can include a feedback channel 57a to carry information concerning the multipath tolerances of the modem and information about the amount of multipath back to the variable delay circuit 50. The power based switch 56 allows switching between the filter and the input as illustrated. Modem state information as explained below is fed back through a feedback channel 57b to the variable update gain circuit 53. The power measuring circuit 55a feeds back information regarding the power output from the filter to the power based switch 56 and the automatic tap order selection circuit 52 through feedback channel 57c. Input power as measured by power measuring circuit 55b is fed to the automatic tap order selection circuit 52 and power based switch 56.

A delay can be provided between the fixed and adaptive taps to improve multipath performance and make the multipath resolvable. Because the input power and output power of the filter is a good indicator of the interference suppression, the filter can be automatically applied based on the output power while automatic tap order selection occurs based on modulation used for data and the filter state. The power based switch permits automatic selection of the signal path either through the filter or through a bypass channel 58 to an output 59 as illustrated. The filter also automatically determines an optimum number of adaptive taps dependent on the filter performance and modulation and can adjust the update gain of the filter based on the modem state, data modulation, etc.

The variable delay circuit 50 makes the multipath more discernable and differentiates multipath when it is next to each other by separating the multipath because the equalizer function as a whole tends to perform better if there is greater spacing between the multipath (as long as multipath does not exceed multipath capability of equalizer or channel estimation algorithms). The automatic tap order selection circuit 52 recognizes that it is possible to perform the job with a required number of taps, for example, one or two taps, which may be better suited for different jamming or interfering signals. It is possible to select one or the other or more, or any combination. This structure and function is advantageous if the system is attempting to remove one or two different jamming signals. Thus, the minimum number of taps can be used effectively.

The power measuring circuit 55 feeds back power information into the automatic tap order selection circuit 52, allowing the number of taps to be chosen based on the power output of the filter. Power is a good metric or indicator of how well the filter is working and how much suppression is actually obtained. This can be obtained by measuring the ratio of the output power to the input power, giving an indicator whether the filter is removing jammers. It is possible to look at these relative powers and decide which one of the taps (filters), such as the one or two taps, is the best one to choose.

The variable update gain circuit 53 permits updating of the taps by obtaining feedback of demodulator state information from the receiving modem through the feedback channel 57b. This information allows an adaptive update gain based on the received state of the modem (i.e. whether demodulator is in the preamble search state, preamble state and data state) and the type of modulation used to carry data, such as GMSK, BPSK, QPSK, M-PSK and M-QAM.

As noted before, the power based switch 56 switches the signal between the bypass and the filter output. For example, if the output power is about the same as the input power, the filter is not accomplishing any real suppression and the switch is operable such that the signal is bypassed into the top bypass channel 58 from the input through the power based switch 56 and output to the receiving modem 49. If the filter is operative as measured by the ratio of output power and input power using the power measuring circuit 55, the input signal is switched through the filter 43 and into the output 48 of the summer 43 and through the normalizer 54 and power measuring circuit 55. This switching function can be advantageous because even when the filter is not accomplishing much suppression, the waveform and any noise at the taps will still cause the taps to "jump" or move even a small amount and there is still some distortion imparted to the received signal. Thus, a high-level decision can occur whether the filter should be used or not.

As to the demodulator state information that is fed back to the variable update gain circuit 57 through the channel 57b, it is possible to operate the filter with different gains or different internals depending on the state of the demodulator. Typically, a demodulator will search for a waveform and will run with a particular updated gain function while searching. Once the waveform is detected, it might be possible to slow down the adaptation rate so that the system does not overmodulate or severely distort the received signal. The amount of "jumping" by the taps is decreased. For example, it is possible to run at first with a larger gain (i.e. faster adaptation), but once a signal is acquired, the gain can be made smaller (i.e. slower adaptation by using a smaller gain) so there will be less noise enhancement from the adapting filter taps.

The variable delay 50 at the front end of the adaptive filter 43 gives some separation to the multipath. The feedback from the modem allows information regarding the receiving modem's multipath tolerances and the amount of multipath and allows an adjustment in the delay such that the multipath will not become so large in its separation and extend beyond the functional multipath capability of the receiving modem 49.

In the system for each input, sample y(n)=x(n)−w1*x(n−2−v)−w2*x(n−3−v)−w3*x(n−4−v)−w4*x(n−5−v). Taps are updated with each sample w(i)=w(i) k*x(n−i)*y(n)*. The input/output and taps are all complex.

The normalizing circuits 51,54 receive inputs and feedback from a control or other processor and are operable with a fixed point arithmetic or logic for normalized input and output. For example, if there is a 20 dB jammer, the signal coming out of the filter will be a factor of about 100 smaller, and if using fixed-point math precision, it can be brought back up to obtain more bits and increase the gain of the samples to work better through the system. The input normalizing circuit 51 obtains sample values coming into the filter and attempts to place them in the proper range for filter fixed-point math functions to work without complicating issues.

The amount of normalizing is adjusted from a controller or other processor such that the normalizing function does not modulate data beyond what is desired. This is important depending on the type of waveform, such as a M-PSK constellation, constant amplitude waveform, or a M-QAM constellation. The controller or other processor could operate with a memory function to remember the last gain given to the samples coming out of the normalizing circuit, including the input and output normalizing circuits 51, 54, allowing a small change relative to the signal. It is possible to allow an automatic gain control (AGC) circuit to make some changes on a sample or block basis. There are some sensitivities to changes in amplitude and the normalizing circuits are operable that any M-QAM signal having data or information contained in the amplitude of the waveform is not affected. Any AGC loop could be on both the memory and the input and output normalizing circuits. Any control signal from a controller or other processor could include information relating to the modulation type and demodulator state.

Overall, the adaptive filter will accomplish better performance if there is greater spacing between the multipath and the variable delay circuit 50 provides such spacing. If only the first tap is used, for example, when the variable delay circuit 50 is not operable, the multipath tends to group together and the taps can move to a non-zero value if there is an interferer. As illustrated and as noted before, there are three or four taps in the filter operable to attack three or four interferers. If only one or two taps are desired and used such that the number of taps are reduced, then the multipath spread introduced by adaptive filter is less since it had to remove fewer interferers or jammers.

It should be understood that as part of the demodulation process, a faster filter update gain can be used for the preamble search and preamble state of demodulator. The preamble portion of waveform tends to be less susceptible to waveform variation and to gain variations of the adaptive taps than the data portion of waveform, and thus, once the demodulator detects a preamble, it could slow down the adaptation rate of filter taps through the feedback mechanism so that the filter adaptation is slower for the data portion of waveform. With feedback from the demodulator, the adaptive filter can adjust the gain of the filter taps as desired by the state of demodulator.

The automatic tap order selection circuit 52 takes advantage of the fact that there is not necessarily a requirement to use four taps, but three, two or one tap can be used to overcome the disadvantages of a fixed structure.

Typically, the filters as described can be implemented within a Field Programmable Gate Array (FPGA) that is fast enough to implement the modem functions of the waveform. With the improvement in digital signal processors, however, various DSP circuits could also be used.

The filter function can be implemented in C code (or assembly language) to establish a narrow band interference (NEI) adaptive filter as either a FIR or IIR filter. Different variables can be defined, including channel buffers, complex demodulation, and power output sums. Filter state and filter taps are tracked as well as the gain, number of taps, and number of adapted taps. As the filter state is tracked, the output power with the adaptive taps is updated.

The C code can define if the modem is in a search mode, for example, searching for a waveform such as a M-QAM, M-PSK or GMSK waveform for tracking the filter. The update gain of the filter can be adjusted based on the demodulator state. Also, the variable delay is implemented by defining the number of taps and the number of adaptive taps and the difference can be the delay between a first fixed tap and the first adaptive tap. This can be implemented in C code, for example. The filter state values can be shuffled to make room for a next input. The C code can also define the output power relative to the input power to allow interference reduction and automatically select the filter operation by bypassing into the output or through the filter using the switch.

Figure 3:
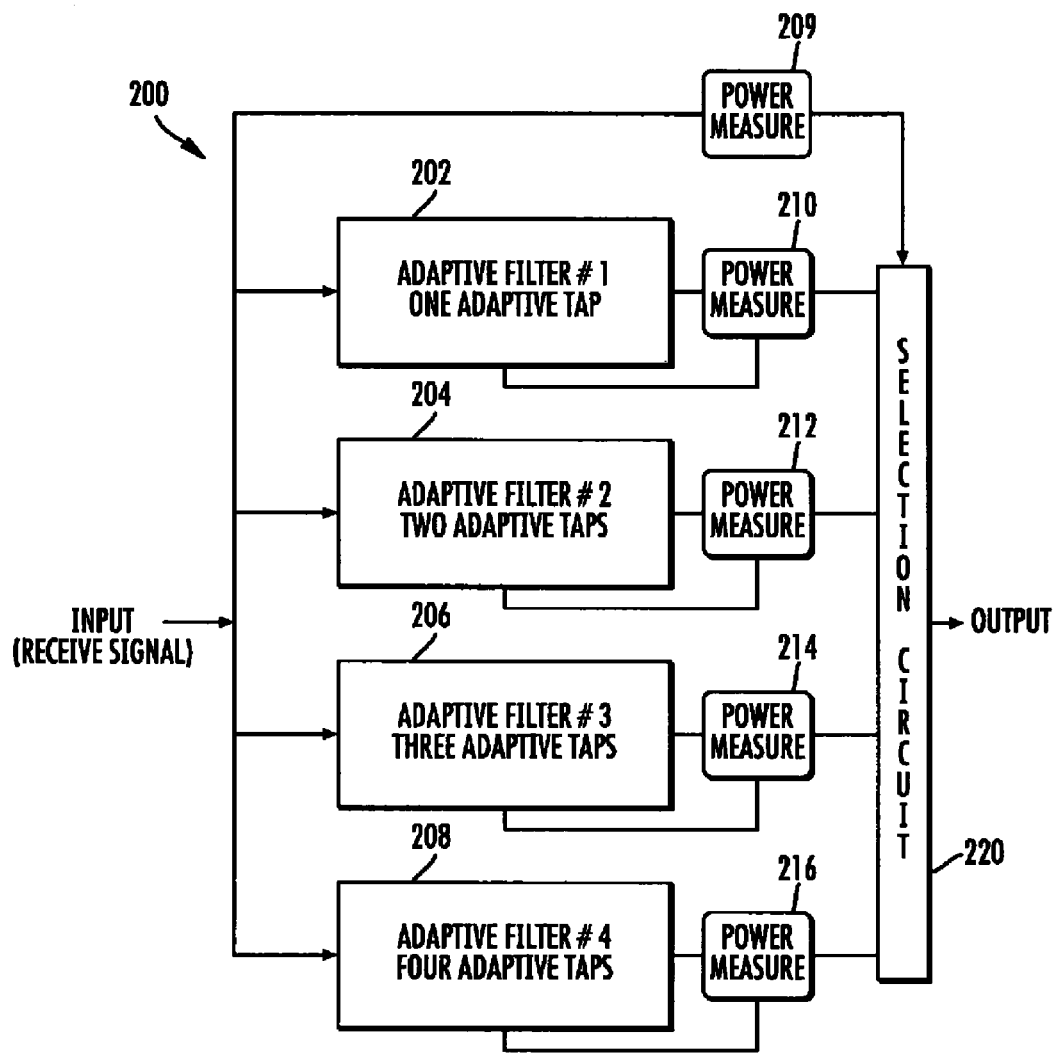
FIG. 3 is a block diagram showing a plurality of adaptive filters in parallel each having a different number of adaptive taps such that the filter with smallest output power or most suppression or other criterion is selected as an output.

FIG. 3 is an adaptive filter system 200 having four adaptive filters 202, 204, 206, and 208 positioned parallel. The first adaptive filter 202 has one adaptive tap. The second adaptive filter 204 has two adaptive taps. The third adaptive filter 206 has three adaptive taps. The fourth adaptive filter 208 has four adaptive taps. A power measuring circuit 209 measures the input power. Each adaptive filter has a respective power measuring circuit 210, 212, 214, and 216 with appropriate feedback of the type as mentioned relative to FIG. 2. The adaptive filters and power measuring circuit are shown in basic diagrammatic view only. Each power measuring circuit is output into a selection circuit 220 for final output. The received signal is input into each adaptive filter. The selection circuit 220 senses the output power from each adaptive filter and selects the adaptive filter with the most suppression or smallest output power as the adaptive filter to use as the output in the circuit 200.

FIGS. 4-9 are various graphs that were generated to show the effect of gain values and the number of taps on the performance of the adaptive filter and its effect on a demodulated waveform. These graphs show the effects of these parameters and the trade offs that are required. The NEI or adaptive filter as explained before is established to track interferers that are changing in frequency or turning on/off. A faster filter introduces more noise, and thus this type of filter would be required only for more robust waveforms such that the tracking speed of the adaptive filter is improved by knowing the modulation. Also, the fewer taps in the adaptive filter, the faster the adaptive filter can adapt to the interferer but the fewer interferers it can handle. These graphs can illustrate this problem and solution.

FIGS. 4A, 4B and 4C are graphs showing the effect of the update gain on Gaussian noise input in which FIG. 4A shows the gain at $\frac{1}{2}^7$, FIG. 4B shows the gain at $\frac{1}{2}^3$, and FIG. 4C shows the gain at $\frac{1}{2}^{10}$. Ten thousand (10,000) iterations with the last one thousand (1,000) are displayed. The Gaussian noise input will force the taps to train to zero and the amount of variability is a function of the update gain. The first filter tap is typically a one, and as a result, the plus (+) sign at the right portion of the graph is fixed at around 4,096 for the fixed-point simulation. The scattering around zero pertain to the four taps of the adaptive filter. There is excessive moving of the taps as shown when the gain is $\frac{1}{2}^3$. The graph shows that the variable adaptive gain and update affects the waveform. When the gain is $\frac{1}{2}^7$, the error of the signal is slowing, making it smaller by $\frac{1}{16}$. The gain of 3, as shown in FIG. 4B, is operative as $\frac{1}{8}$ and the filter functions to take the output error and divide it by 8. The signal error is fed as the adaptive tap. If the gain of 3 is left for demodulation, the taps will change too much. As illustrated in FIG. 4C, the gain of $\frac{1}{2}^{10}$ offers the best performance and the taps move very little.

It should be understood that if there is an interferer or jammer present, the filter should be able to adapt quickly. A gain of $\frac{1}{2}^{10}$ is slow, but there is still a trade-off for how fast the system can adapt.

FIGS. 5A, 5B and 5C show the effect of the update gain on Gaussian noise plus a tone (20 dB) input. The tone could correspond to a carrier. As shown by the results in these graphs, when there is a gain of $\frac{1}{2}^7$ and $\frac{1}{2}^{10}$, there is little difference, and thus, the gain of $\frac{1}{2}^7$ would probably be sufficient since the gain of $\frac{1}{2}^{10}$ would adapt much slower than $\frac{1}{2}^7$. With the gain of $\frac{1}{2}^3$, the taps are still moving around excessively, and thus, the gain of $\frac{1}{2}^3$ would not be desired. The graph results show that the taps with the gain of $\frac{1}{2}^3$ are in a different location than the updated gains of $\frac{1}{2}^7$ and $\frac{1}{2}^{10}$. Once the system adapts to the gain of $\frac{1}{2}^7$ as shown in FIG. 5A, the system typically stays fixed. The filter operating at the gain of $\frac{1}{2}^{10}$ would be excessively slow as compared to the filter operative with the gain of $\frac{1}{2}^7$ and not as desirable.

FIGS. 6A, 6B and 6C show the effect of the update gain on a GMSK signal input with the GMSK by itself. The gain of $\frac{1}{2}^3$ is poor, but the gain of $\frac{1}{2}^{10}$ is better than the gain of $\frac{1}{2}^7$, and thus, is desired.

FIGS. 7A, 7B and 7C show the effect of the update gain on the GMSK plus a tone (20 dB) input and showing that the gain of $\frac{1}{2}^7$ is advantageous and more efficient than the gain of $\frac{1}{2}^{10}$. The gain of $\frac{1}{2}^3$ still shows the taps moving excessively.

Figure 8:
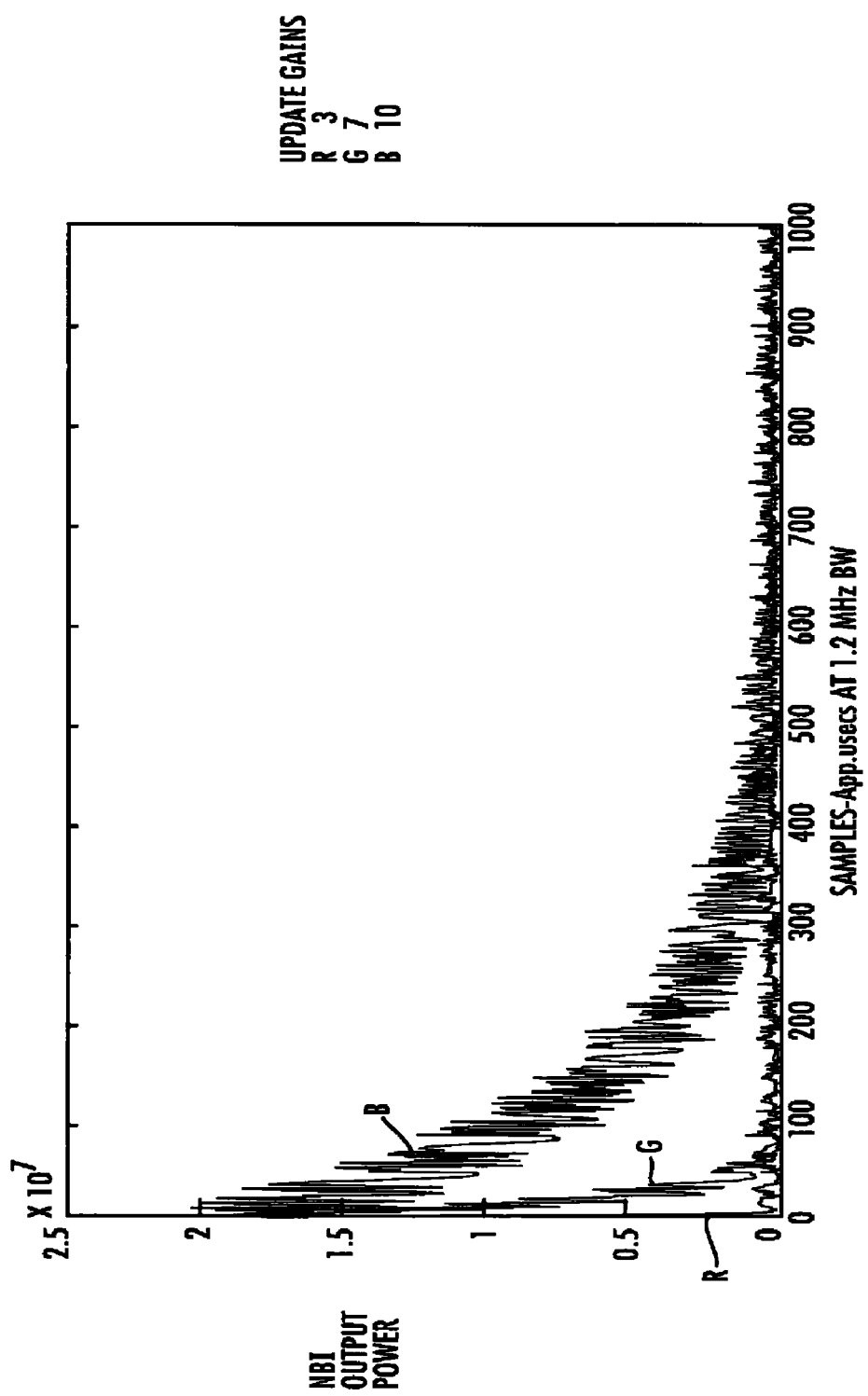
FIG. 8 is a graph showing the effect of the update gain on the GMSK signal and tone (20 dB) input, and showing the settling time with the update gains of $\frac{1}{2}^7$, $\frac{1}{2}^3$ and $\frac{1}{2}^{10}$ in accordance with a non-limiting example of the present invention.
Figure 9A:
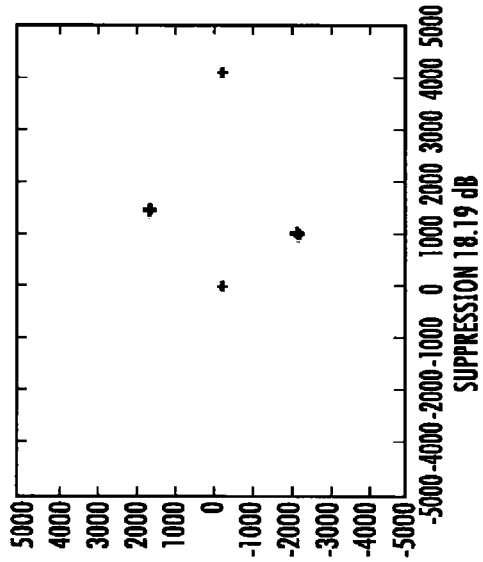
FIGS. 9A through 9D show the effect of the number of adaptive taps on the GMSK signal and the tone (20 dB) input with the various suppressions at 16.87, 18.19, 18.79 and 19.22 dB in accordance with a non-limiting example of the present invention.
Figure 9B:
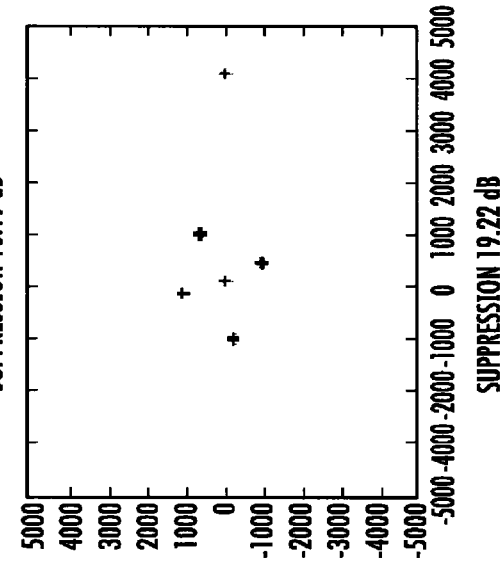
Figure 9C:
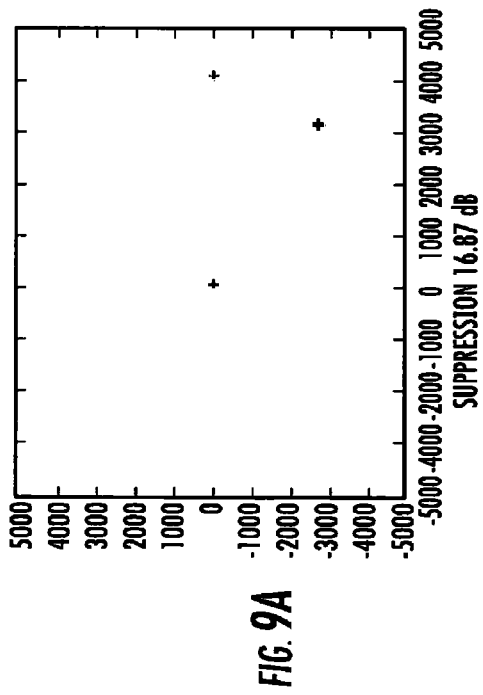
Figure 9D:
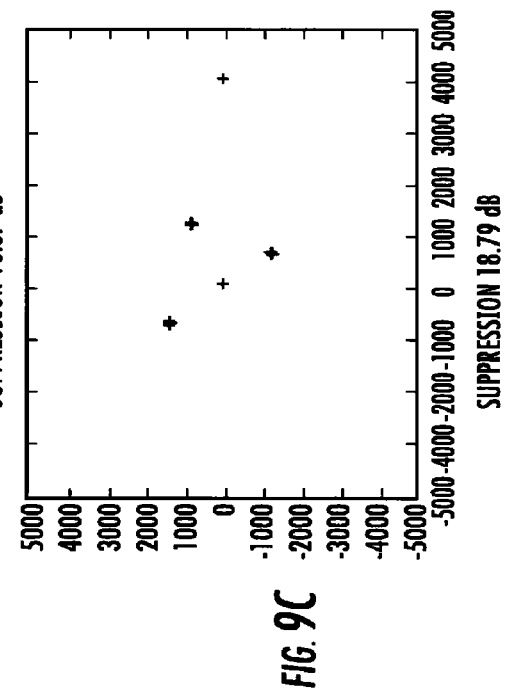

FIG. 8 is a graph showing the effect of the update gain on the GMSK plus the tone (20 dB) input signal and showing the settling time with an updated gain shown in the graph for the narrow band interference (NBI) output power as an NBI filter. The graph displays the adaptation results and how long it takes to obtain a smaller output power, indicating that the NBI FIR filter is removing the jammer or interferer. With an adaptation of $\frac{1}{2}^{10}$ (as $\frac{1}{1024}$), it has taken a longer time to obtain the goal. The update gain of $\frac{1}{2}^3$ shows that it is quick, but there is extra noise. The update gain of $\frac{1}{2}^7$ shows the system is quick with less noise. The adaptation rates depend on the state of the modem. The update gain of $\frac{1}{2}^3$ would take out the jammer quickly. If the power at the input and output change, then the adaptation can be slowed. Thus, the system performance can be improved by monitoring the power at the output, monitoring the adaptation, and monitoring the state of the modem.

FIGS. 9A, 9B, 9C and 9D show the effect of the number of adaptive taps on the GMSK plus the tone (20 dB) input with different suppression at different decibel (dB) ranges. For example, if there is not a large interferer, it may be necessary to use fewer taps, for example, only two taps at 15 dB. If there is a larger interferer, then more taps would be desirable. The filter provides an intelligent manner to manage the number of taps.

Overall the system provides multiple delay taps and a variable delay at the front-end such that the first few taps do not have to be used while different delays can be used. A "one" can be used for the first filter tap and some filter taps can be skipped. The output power can be monitored as noted before such that the filter determines which branch to use and whether the input signal should be bypassed directly to output into the filter. The filter can operate with different filter taps, for example, a filter with 1, 2, 3 or 4 taps, while the power output can be monitored to determine which branch to use as noted before. The gain of the filter can be adapted based on whether the system is searching such as for a waveform and whether the system is in a preamble mode or data mode and whether a certain modulation is used. Depending on the type of signal constellation used to transmit data, much of the transmitted information is in the phase and not the amplitude (i.e. M-PSK), and thus, the system would be less likely to be hurt by faster filter update gains. If the system knows it will receive a M-QAM constellation, it could consider slowing the filter update gain and increase normalizing circuit memory after the preamble, and thus, the system can exploit what knowledge it has.

For purposes of description, some background information on coding, interleaving, and an exemplary wireless, mobile radio communications system that includes ad-hoc capability and can be modified for use is set forth. This example of a communications system that can be used and modified for use with the present invention is now set forth with regard to FIGS. 10 and 11.

An example of a radio that could be used with such system and method is a Falcon™ III radio manufactured and sold by Harris Corporation of Melbourne, Fla. This type of radio can support multiple wavebands form 30 MHz up to 2 GHz, including L-band SATCOM and MANET. The waveforms can provide secure IP data networking. It should be understood that different radios can be used, including software defined radios that can be typically implemented with relatively standard processor and hardware components. One particular class of software radio is the Joint Tactical Radio (JTR), which includes relatively standard radio and processing hardware along with any appropriate waveform software modules to implement the communication waveforms a radio will use. JTR radios also use operating system software that conforms with the software communications architecture (SCA) specification (see www.jtrs.saalt.mil), which is hereby incorporated by reference in its entirety. The SCA is an open architecture framework that specifies how hardware and software components are to interoperate so that different manufacturers and developers can readily integrate the respective components into a single device.

The Joint Tactical Radio System (JTRS) Software Component Architecture (SCA) defines a set of interfaces and protocols, often based on the Common Object Request Broker Architecture (CORBA), for implementing a Software Defined Radio (SDR). In part, JTRS and its SCA are used with a family of software re-programmable radios. As such, the SCA is a specific set of rules, methods, and design criteria for implementing software re-programmable digital radios.

The JTRS SCA specification is published by the JTRS Joint Program Office (JPO). The JTRS SCA has been structured to provide for portability of applications software between different JTRS SCA implementations, leverage commercial standards to reduce development cost, reduce development time of new waveforms through the ability to reuse design modules, and build on evolving commercial frameworks and architectures.

The JTRS SCA is not a system specification, as it is intended to be implementation independent, but a set of rules that constrain the design of systems to achieve desired JTRS objectives. The software framework of the JTRS SCA defines the Operating Environment (OE) and specifies the services and interfaces that applications use from that environment. The SCA OE comprises a Core Framework (CF), a CORBA middleware, and an Operating System (OS) based on the Portable Operating System Interface (POSIX) with associated board support packages. The JTRS SCA also provides a building block structure (defined in the API Supplement) for defining application programming interfaces (APIs) between application software components.

The JTRS SCA Core Framework (CF) is an architectural concept defining the essential, "core" set of open software Interfaces and Profiles that provide for the deployment, management, interconnection, and intercommunication of software application components in embedded, distributed-computing communication systems. Interfaces may be defined in the JTRS SCA Specification. However, developers may implement some of them, some may be implemented by non-core applications (i.e., waveforms, etc.), and some may be implemented by hardware device providers.

Figure 10:
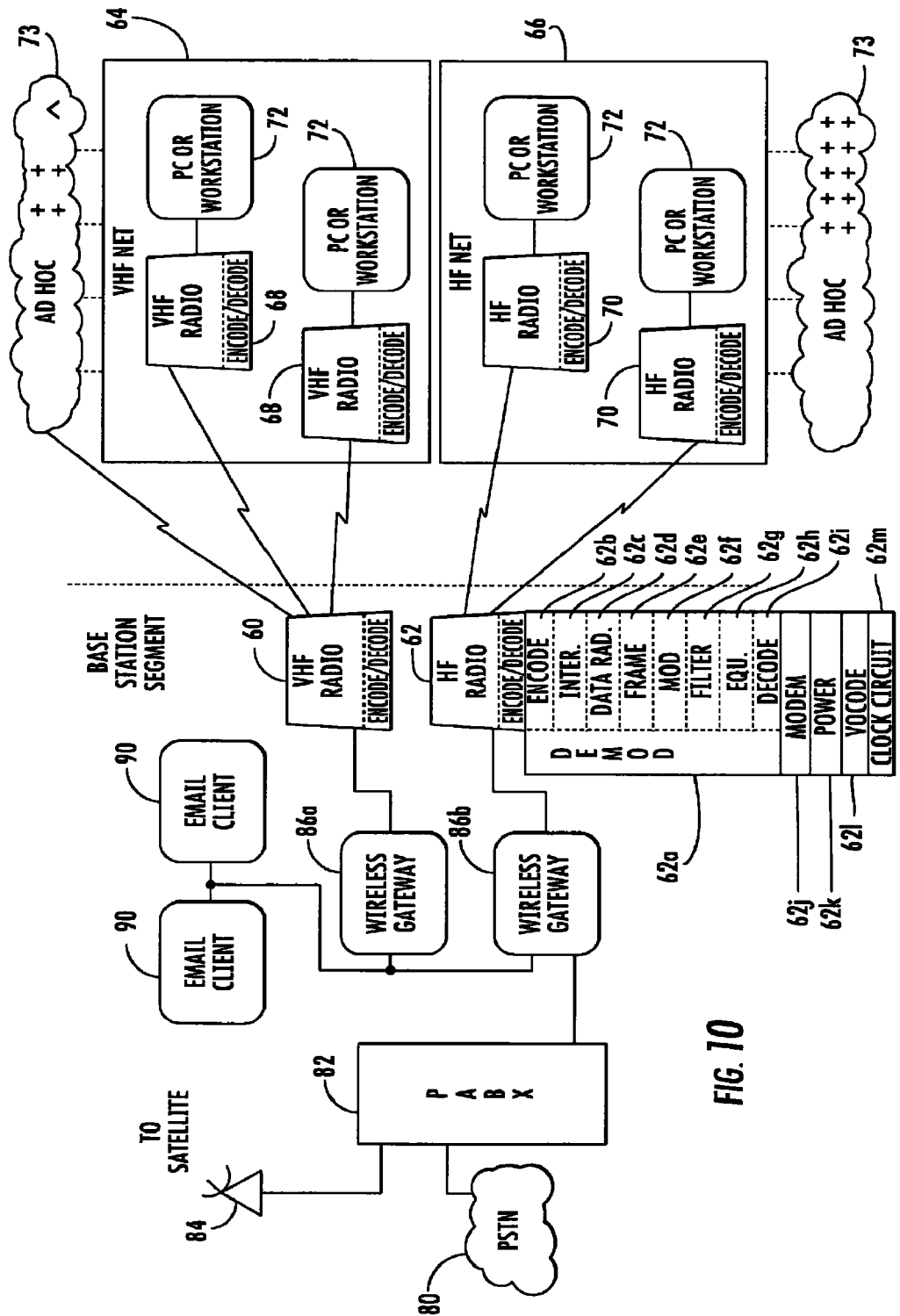
FIG. 10 is a block diagram of an example of a communications system that can be used in accordance with a non-limiting example of the present invention.

For purposes of description only, a brief description of an example of a communications system that includes communications devices that incorporate the filter in accordance with a non-limiting example, is described relative to a non-limiting example shown in FIG. 10. This high-level block diagram of a communications system includes a base station segment and wireless message terminals that could be modified for use with the present invention. The base station segment includes a VHF radio 60 and HF radio 62 that communicate and transmit voice or data over a wireless link to a VHF net 64 or HF net 66, each which include a number of respective VHF radios 68 and HF radios 70, and personal computer workstations 72 connected to the radios 68,70. Ad-hoc communication networks 73 are interoperative with the various components as illustrated. The entire network can be ad-hoc and include source, destination and neighboring mobile nodes. Thus, it should be understood that the HF or VHF networks include HF and VHF net segments that are infrastructure-less and operative as the ad-hoc communications network. Although UHF and higher frequency radios and net segments are not illustrated, these could be included.

The radio can include a demodulator circuit 62a and appropriate convolutional encoder circuit 62b, block interleaver 62c, data randomizer circuit 62d, data and framing circuit 62e, modulation circuit 62f, matched filter circuit 62g, block or symbol equalizer circuit 62h with an appropriate clamping device, deinterleaver and decoder circuit 62i modem 62j, and power adaptation circuit 62k as non-limiting examples. A vocoder circuit 62l can incorporate the decode and encode functions and a conversion unit could be a combination of the various circuits as described or a separate circuit. A clock circuit 62m can establish the physical clock time and through second order calculations as described below, a virtual clock time. The network can have an overall network clock time. These and other circuits operate to perform any functions necessary for the present invention, as well as other functions suggested by those skilled in the art. Other illustrated radios, including all VHF (or UHF) and higher frequency mobile radios and transmitting and receiving stations can have similar functional circuits. Radios could range from 30 MHz to about 2 GHz as non-limiting examples.

The base station segment includes a landline connection to a public switched telephone network (PSTN) 80, which connects to a PABX 82. A satellite interface 84, such as a satellite ground station, connects to the PABX 82, which connects to processors forming wireless gateways 86a, 86b. These interconnect to the VHF radio 60 or HF radio 62, respectively. The processors are connected through a local area network to the PABX 82 and e-mail clients 90. The radios include appropriate signal generators and modulators.

An Ethernet/TCP-IP local area network could operate as a "radio" mail server. E-mail messages could be sent over radio links and local air networks using STANAG-5066 as second-generation protocols/waveforms, the disclosure which is hereby incorporated by reference in its entirety and, of course, preferably with the third-generation interoperability standard: STANAG-4538, the disclosure which is hereby incorporated by reference in its entirety. An interoperability standard FED-STD-1052, the disclosure which is hereby incorporated by reference in its entirety, could be used with legacy wireless devices. Examples of equipment that can be used in the present invention include different wireless gateway and radios manufactured by Harris Corporation of Melbourne, Fla. This equipment could include RF5800, 5022, 7210, 5710, 5285 and PRC 117 and 138 series equipment and devices as non-limiting examples.

These systems can be operable with RF-5710A high-frequency (HF) modems and with the NATO standard known as STANAG 4539, the disclosure which is hereby incorporated by reference in its entirety, which provides for transmission of long distance radio at rates up to 9,600 bps. In addition to modem technology, those systems can use wireless email products that use a suite of data-link protocols designed and perfected for stressed tactical channels, such as the STANAG 4538 or STANAG 5066, the disclosures which are hereby incorporated by reference in their entirety. It is also possible to use a fixed, non-adaptive data rate as high as 19,200 bps with a radio set to ISB mode and an HF modem set to a fixed data rate. It is possible to use code combining techniques and ARQ.

Figure 11:
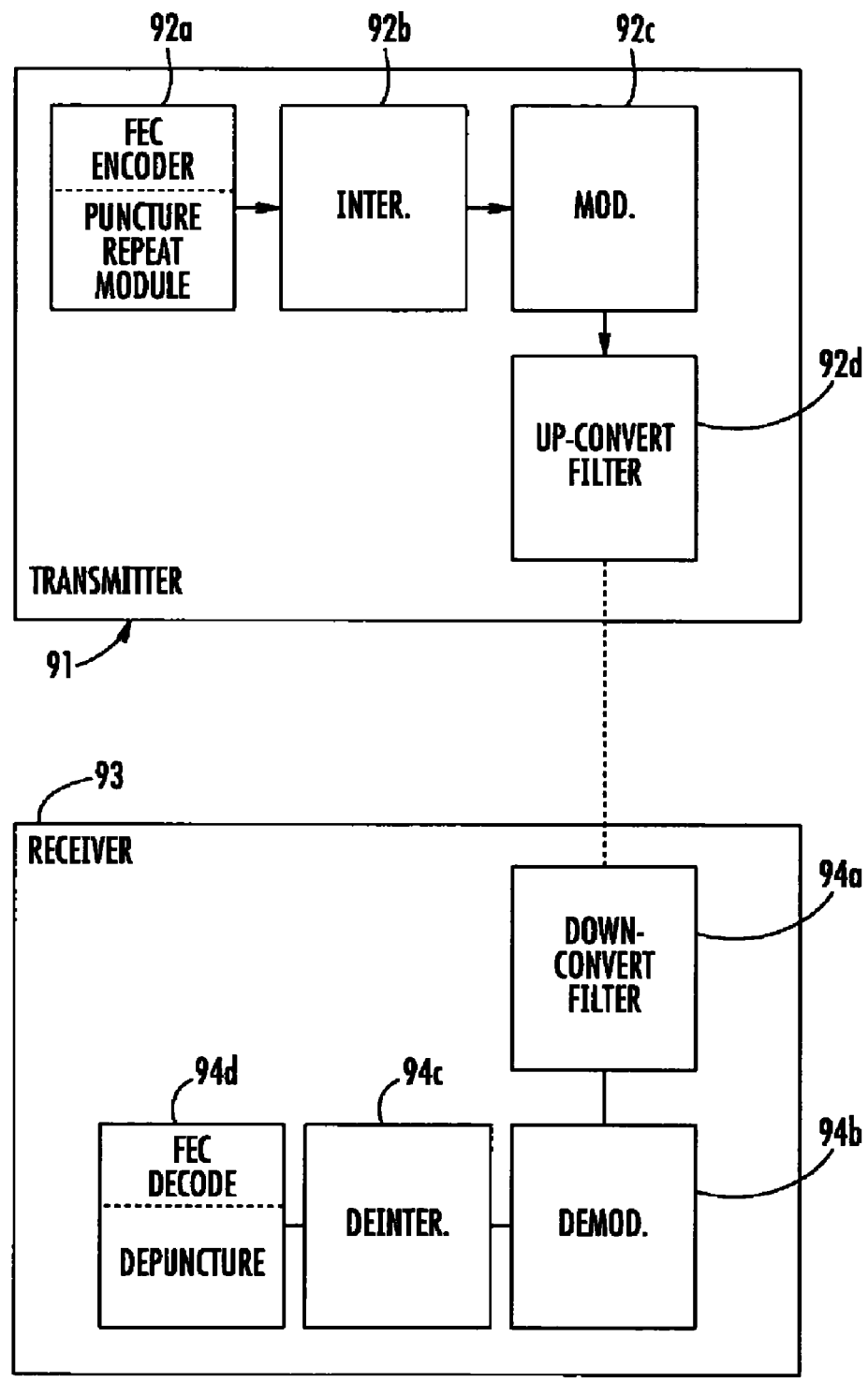
FIG. 11 is a high-level block diagram showing basic components that can be used in accordance with a non-limiting example of the present invention.

A communications system that incorporates communications devices can be used in accordance with non-limiting examples of the present invention and is shown in FIG. 11. A transmitter is shown at 91 and includes basic functional circuit components or modules, including a forward error correction encoder 92a that includes a puncturing module, which could be integral to the encoder or a separate module. The decoder 92a and its puncturing module includes a function for repeating as will be explained below. Encoded data is interleaved at an interleaver 92b, for example, a block interleaver, and in many cases modulated at modulator 92c. This modulator can map the communications data into different symbols based on a specific mapping algorithm to form a communications signal. For example, it could form Minimum Shift Keying or Gaussian Minimum Shift Keying (MSK or GMSK) symbols. Other types of modulation could be used in accordance with non-limiting examples of the present invention. Up-conversion and filtering occurs at an up-converter and filter 92d, which could be formed as an integrated module or separate modules. Communications signals are transmitted, for example, wirelessly to receiver 93.

At the receiver 93, down conversion and filtering occurs at a down converter and filter 94a, which could be integrated or separate modules. The signal is demodulated at demodulator 94b and deinterleaved at deinterleaver 94c. The deinterleaved data (i.e. bit soft decisions) is decoded and depunctured (for punctured codes), combined (for repeated codes) and passed through (for standard codes) at decoder 94d, which could include a separate or integrated depuncturing module. The system, apparatus and method can use different modules and different functions. These components as described could typically be contained within one transceiver.

It should be understood, in one non-limiting aspect of the present invention, a rate ½, K=7 convolutional code can be used as an industry standard code for forward error correction (FEC) during encoding. For purposes of understanding, a more detailed description of basic components now follows. A convolutional code is an error-correcting code, and usually has three parameters (n, k, m) with n equal to the number of output bits, k equal to the number of input bits, and m equal to the number of memory registers, in one non-limiting example. The quantity k/n could be called the code rate with this definition and is a measure of the efficiency of the code. K and n parameters can range from 1 to 8, m can range from 2 to 10, and the code rate can range from ⅛ to ⅞ in non-limiting examples. Sometimes convolutional code chips are specified by parameters (n, k, L) with L equal to the constraint length of the code as L=k (m−1). Thus, the constraint length can represent the number of bits in an encoder memory that would affect the generation of n output bits. Sometimes the letters may be switched depending on the definitions used.

The transformation of the encoded data is a function of the information symbols and the constraint length of the code. Single bit input codes can produce punctured codes that give different code rates. For example, when a rate ½ code is used, the transmission of a subset of the output bits of the encoder can convert the rate ½ code into a rate ⅔ code. Thus, one hardware circuit or module can produce codes of different rates. Punctured codes allow rates to be changed dynamically through software or hardware depending on channel conditions, such as rain or other channel impairing conditions.

An encoder for a convolutional code typically uses a lookup table for encoding, which usually includes an input bit as well as a number of previous input bits (known as the state of the encoder), the table value being the output bit or bits of the encoder. It is possible to view the encoder function as a state diagram, a tree diagram or a trellis diagram.

Decoding systems for convolutional codes can use 1) sequential decoding, or 2) maximum likelihood decoding, also referred to as Viterbi decoding, which typically is more desirable. Sequential decoding allows both forward and backward movement through the trellis. Viterbi decoding as maximum likelihood decoding examines a receive sequence of given length, computes a metric for each path, and makes a decision based on the metric.

Puncturing convolutional codes is a common practice in some systems and is used in accordance with non-limiting examples of the present invention. It should be understood that in some examples a punctured convolutional code is a higher rate code obtained by the periodic elimination of specific code bits from the output of a low rate encoder. Punctured convolutional code performance can be degraded compared with original codes, but typically the coding rate increases.

Some of the basic components that could be used as non-limiting examples of the present invention include a transmitter that incorporates a convolutional encoder, which encodes a sequence of binary input vectors to produce the sequence of binary output vectors and can be defined using a trellis structure. An interleaver, for example, a block interleaver, can permute the bits of the output vectors. The interleaved data would also be modulated at the transmitter (by mapping to transmit symbols) and transmitted. At a receiver, a demodulator demodulates the signal.

A block deinterleaver recovers the bits that were interleaved. A Viterbi decoder could decode the deinterleaved bit soft decisions to produce binary output data.

Often a Viterbi forward error correction module or core is used that would include a convolutional encoder and Viterbi decoder as part of a radio transceiver as described above. For example if the constraint length of the convolutional code is 7, the encoder and Viterbi decoder could support selectable code rates of ½, ⅔, ¾, ⅘, ⅚, 6/7, ⅞ using industry standard puncturing algorithms.

Different design and block systems parameters could include the constraint length as a number of input bits over which the convolutional code is computed, and a convolutional code rate as the ratio of the input to output bits for the convolutional encoder. The puncturing rate could include a ratio of input to output bits for the convolutional encoder using the puncturing process, for example, derived from a rate ½ code.

The Viterbi decoder parameters could include the convolutional code rate as a ratio of input to output bits for the convolutional encoder. The puncture rate could be the ratio of input to output bits for the convolutional encoder using a puncturing process and can be derived from a rate ½ mother code. The input bits could be the number of processing bits for the decoder. The Viterbi input width could be the width of input data (i.e. soft decisions) to the Viterbi decoder. A metric register length could be the width of registers storing the metrics. A trace back depth could be the length of path required by the Viterbi decoder to compute the most likely decoded bit value. The size of the memory storing the path metrics information for the decoding process could be the memory size. In some instances, a Viterbi decoder could include a First-In/First-Out (FIFO) buffer between depuncture and Viterbi function blocks or modules. The Viterbi output width could be the width of input data to the Viterbi decoder.

The encoder could include a puncturing block circuit or module as noted above. Usually a convolutional encoder may have a constraint length of 7 and take the form of a shift register with a number of elements, for example, 6. One bit can be input for each clock cycle. Thus, the output bits could be defined by a combination of shift register elements using a standard generator code and be concatenated to form an encoded output sequence. There could be a serial or parallel byte data interface at the input. The output width could be programmable depending on the punctured code rate of the application.

A Viterbi decoder in non-limiting examples could divide the input data stream into blocks, and estimate the most likely data sequence. Each decoded data sequence could be output in a burst. The input and calculations can be continuous and require four clock cycles for every two bits of data in one non-limiting example. An input FIFO can be dependent on a depuncture input data rate.

It should also be understood that the present invention is not limited to convolutional codes and similar FEC, but also turbo codes could be used as high-performance error correction codes or low-density parity-check codes that approach the Shannon limit as the theoretical limit of maximum information transfer rate over a noisy channel. Thus, some available bandwidth can be increased without increasing the power of the transmission. Instead of producing binary digits from the signal, the front-end of the decoder could be designed to produce a likelihood measure for each bit.

Figure 12:
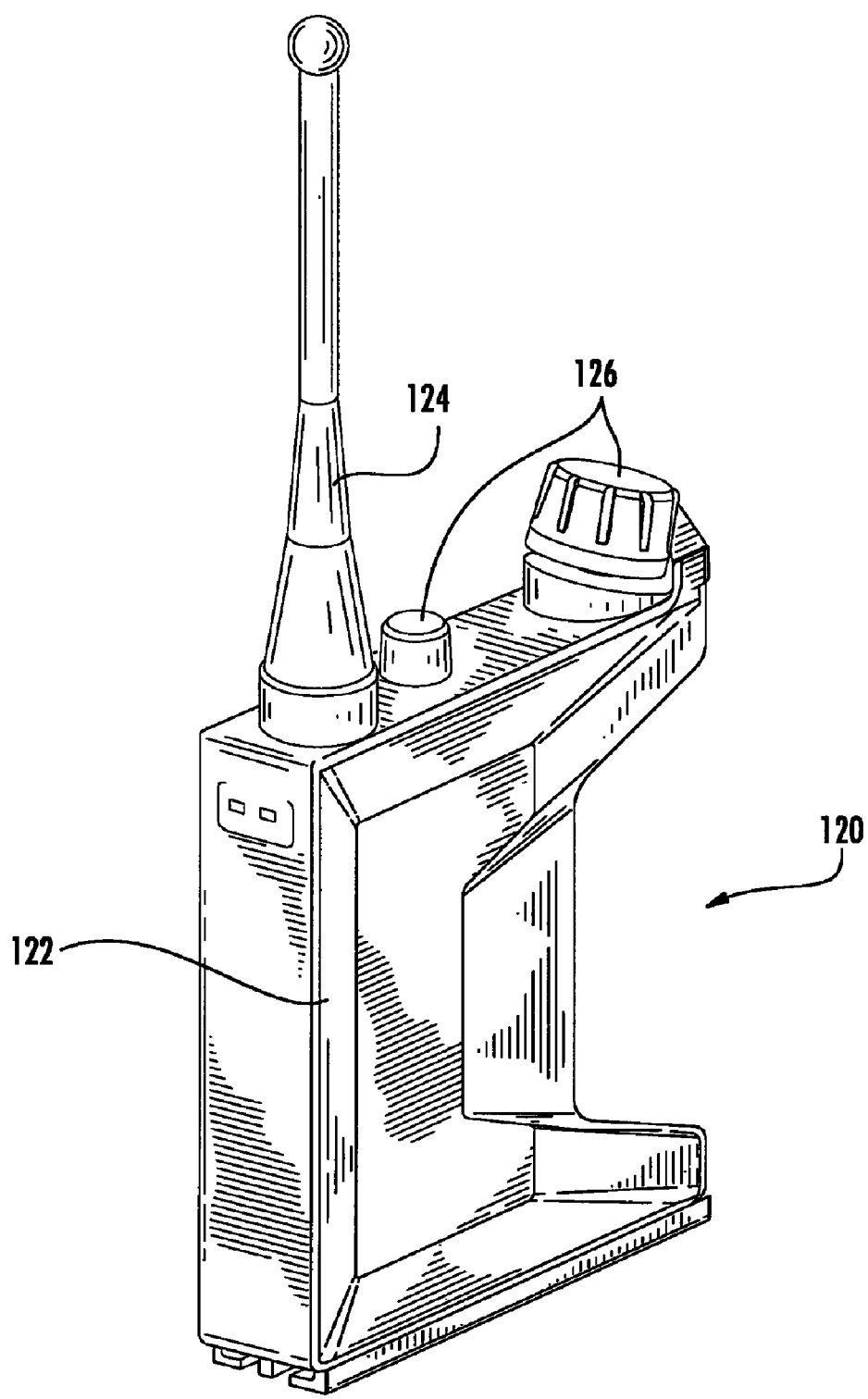
FIG. 12 is a perspective view of a portable wireless communications device as a handheld radio that could incorporate the communications system and adaptive filter in accordance with a non-limiting example of the present invention.

The system and FIR filter, in accordance with non-limiting examples of the present invention, can be used in multiprocessor embedded systems and related methods and also used for any type of radio software communications architecture as used on mainframe computers or small computers, including laptops with an added transceiver, such as used by military and civilian applications, or in a portable wireless communications device 120 as illustrated in FIG. 12. The portable wireless communications device is illustrated as a radio that can include a transceiver as an internal component and handheld housing 122 with an antenna 124 and control knobs. A Liquid Crystal Display (LCD) or similar display can be positioned on the housing in an appropriate location for display. The various internal components, including dual processor systems for red and black subsystems and software that is conforming with SCA, is operative with the illustrated radio. Although a portable or handheld radio is disclosed, the architecture as described can be used with any processor system operative with the system in accordance with non-limiting examples of the present invention. An example of a communications device that could incorporate the adaptive filter, in accordance with non-limiting examples of the present invention, is the Falcon® III manpack or tactical radio platform manufactured by Harris Corporation of Melbourne, Fla.

This application is related to copending patent applications entitled, "COMMUNICATIONS SYSTEM USING ADAPTIVE FILTER THAT IS SELECTED BASED ON OUTPUT POWER," and "COMMUNICATIONS SYSTEM USING ADAPTIVE FILTER AND SELECTED ADAPTIVE FILTER TAPS," and "COMMUNICATIONS SYSTEM USING ADAPTIVE FILTER WITH ADAPTIVE UPDATE GAIN," and "COMMUNICATIONS SYSTEM USING ADAPTIVE FILTER WITH NORMALIZATION CIRCUIT," and "COMMUNICATIONS SYSTEM USING ADAPTIVE FILTER AND VARIABLE DELAY BEFORE ADAPTIVE FILTER TAPS" and "COMMUNICATIONS SYSTEM USING ADAPTIVE FILTER CIRCUIT USING PARALLEL ADAPTIVE FILTERS" which are filed on the same date and by the same assignee and inventors, the disclosures which are hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A communications system for receiving a modulated signal that carries encoded communications data, comprising:
    an adaptive filter circuit having a plurality of parallel adaptive filters, wherein each adaptive filter comprises a plurality of non-adaptive and adaptive filter taps with weighted coefficients and an interference reduction circuit that is selected as responsive to one of at least the receive state of a demodulator and the type of modulation used by the communication system;
    a first power detector, coupled to the input of each of the adaptive filters, for detecting an input power;
    a second power detector, coupled to the output of each of the adaptive filters, for detecting an output power;
    an updating unit for updating a gain of the adaptive filter based on the input power and the output power;
    a selecting unit for selecting the number and order of adaptive filter taps;
    a separating unit for separating the spacing of multipath introduced by adaptive filter circuit;
    a first control unit for controlling a normalizing block at an input to each adaptive filter; a second control unit for controlling a normalizing block at output of filter and a switch for bypassing the adaptive filter to an output;
    a demodulator for demodulating the signal; and
    a decoder that receives the filtered output signal from the demodulator and decodes the signal to obtain the communications data.

2. The communications system according to claim 1, wherein each interference reduction circuit comprises an adaptive gain circuit for updating the adaptive gain of the adaptive filter responsive to a receive state of a demodulator and/or the type of modulation used by communication system.

3. The communications system according to claim 1, wherein each interference reduction circuit comprises a tap order selection circuit for selecting the number and order of adaptive filter taps based on one of at least input power to the adaptive filter, the output power from the adaptive filter and the type of modulation used by communication system.

4. The communications system according to claim 1, wherein each interference reduction circuit comprises a variable delay circuit operative before the adaptive filter taps and weighted coefficients for separating the spacing of multipath introduced by adaptive filter and producing a filtered output signal with improved multipath performance and reduction of narrowband interference.

5. The communications system according to claim 1, wherein each interference reduction circuit comprises a switch operative for selecting if original received signal or output of adaptive filter is passed to demodulator.

6. The communications system according to claim 1, wherein each adaptive filter is responsive to a Least Means Square (LMS), Recursive Least Squares (RLS) Minimum Mean-Square Error (MMSE) estimation as an adaptive algorithm that iterates over weighted coefficients towards a gradient to reduce error and generate new weighted coefficients.

7. The communications system according to claim 1, which further comprises a wireless communications device incorporating the demodulator, equalizer and decoder.

8. A method of communicating, comprising:
    receiving a modulated signal that carries encoded communications data;
    filtering the received signal within an adaptive filter circuit having a plurality of parallel adaptive filters each having a plurality of non-adaptive and adaptive filter taps with weighted coefficients while reducing interference responsive to one of at least the receive state of a demodulator, the type of modulation used by communication system;
    detecting, using a first power detector, an input power;
    detecting, using a second power detector, an output power;
    updating a gain of the adaptive filter based on the input power and the output power;
    selecting the number and order of adaptive filter taps;
    separating the spacing of multipath introduced by the adaptive filter;
    controlling, at the input and output of each adaptive filters, input and output normalizing circuits and bypassing the adaptive filter to an output; and
    demodulating and decoding the signal after filtering to obtain the communications data.

9. The method according to claim 8, which further comprises updating the adaptive taps of a selected adaptive filter responsive to a receive state of a demodulator and/or the type of modulation used by communication system.

10. The method according to claim 8, which further comprises selecting whether to pass original received signal or signal output by adaptive filter to demodulator based on measured input and output power of the adaptive filter.

11. The method according to claim 8, which further comprises selecting the number and order of adaptive taps within a selected adaptive filter based on one of at least the measured power at the input to the adaptive filter, the measured power at the output of the adaptive filter and the type of modulation used by communication system.

12. The method according to claim 8, which further comprises imparting a variable delay before the adaptive filter taps and weighted coefficients for separating the spacing of multipath introduced by adaptive filter and producing a filtered output signal with improved multipath performance and reduction of narrowband interference.

13. The method according to claim 12, which further comprises a normalizing circuit at the input to the adaptive filter circuit to increase gain recovery based on type of modulation used by communication system, the demodulator state such as preamble search, preamble detected and data state and/or other signal acquisition information.

14. The method according to claim 12, which further comprises a normalizing circuit at the output of the adaptive filter circuit to increase gain recovery based on type of modulation used by communication system, the demodulator state such as preamble search, preamble detected and data state and/or other signal acquisition information.

15. A communications system for receiving a modulated signal that carries encoded communications data, comprising:
- an adaptive filter circuit having a plurality of parallel adaptive filters, wherein each adaptive filter comprises a plurality of non-adaptive and adaptive filter taps with weighted coefficients and an interference reduction circuit that is selected as responsive to one of at least the receive state of a demodulator, the type of modulation used by communication system;
- a first power detector, coupled to the input of each of the adaptive filters, for detecting an input power;
- a second power detector, coupled to the output of each of the adaptive filters, for detecting an output power;
- an updating unit for updating a gain of the adaptive filter based on the input power and the output power;
- a selecting unit for selecting the number and order of adaptive filter taps;
- a separating unit for separating the spacing of multipath introduced by adaptive filter circuit;
- a first control unit for controlling a normalizing block at an input to each adaptive filter; a second control unit for controlling a normalizing block at output of filter and a switch for bypassing the adaptive filter to an output;
- a demodulator for demodulating the signal;
- a decoder that receives the filtered output signal from the demodulator and decodes the signal to obtain the communications data; and wherein each interference reduction circuit comprises a variable delay circuit operative before the adaptive filter taps and weighted coefficients for separating the spacing of multipath introduced by the adaptive filter and producing a filtered output signal with improved multipath performance and reduction of narrowband interference.

16. A method of communicating, comprising:
- receiving a modulated signal that carries encoded communications data;
- filtering the received signal within an adaptive filter circuit having a plurality of parallel adaptive filters each having a plurality of non-adaptive and adaptive filter taps with weighted coefficients while reducing interference responsive to one of at least the receive state of a demodulator, the type of modulation used by communication system;
- detecting, using a first power detector, an input power;
- detecting, using a second power detector, an output power;
- updating a gain of the adaptive filter based on the input power and the output power;
- selecting the number and order of adaptive filter taps;
- separating the spacing of multipath introduced by the adaptive filter;
- controlling, at the input and output of each adaptive filters, input and output normalizing circuits and bypassing the adaptive filter to an output;
- demodulating and decoding the signal after filtering to obtain the communications data; and
- imparting a variable delay before the adaptive filter taps and weighted coefficients for separating the spacing of multipath introduced by adaptive filter and producing a filtered output signal with improved multipath performance and reduction of narrowband interference.

\* \* \* \* \*